(12) United States Patent
Adams et al.

(10) Patent No.: US 7,149,941 B2
(45) Date of Patent: Dec. 12, 2006

(54) OPTIMIZED ECC/REDUNDANCY FAULT RECOVERY

(75) Inventors: R. Dean Adams, St. George, VT (US); Gerard M. Salem, Essex Junction, VT (US); Timothy J. von Reyn, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 560 days.

(21) Appl. No.: 10/063,497

(22) Filed: Apr. 30, 2002

(65) Prior Publication Data

US 2003/0204798 A1    Oct. 30, 2003

(51) Int. Cl.
G11C 29/00    (2006.01)

(52) U.S. Cl. .................... 714/723; 714/718; 365/201

(58) Field of Classification Search ............... 714/723, 714/718; 365/200, 201; 711/200; 324/210
See application file for complete search history.

(56) References Cited

U.S. PATENT DOCUMENTS

| | | | | |
|---|---|---|---|---|
| 4,335,459 | A | 6/1982 | Miller | 371/38 |
| 4,891,811 | A | 1/1990 | Ash et al. | 371/21.2 |
| 4,939,694 | A * | 7/1990 | Eaton et al. | 365/200 |
| 5,134,616 | A | 7/1992 | Barth, Jr. et al. | 371/10.3 |
| 5,239,634 | A * | 8/1993 | Buch et al. | 711/200 |
| 5,511,029 | A | 4/1996 | Sawada et al. | 365/201 |
| 5,535,164 | A | 7/1996 | Adams et al. | 365/201 |
| 5,561,671 | A | 10/1996 | Akiyama | 371/48 |
| 5,587,950 | A | 12/1996 | Sawada et al. | 365/201 |
| 5,617,531 | A | 4/1997 | Crouch et al. | 395/183.06 |
| 5,689,466 | A | 11/1997 | Qureshi | 365/201 |
| 5,907,561 | A | 5/1999 | Blish, II et al. | 371/21.1 |
| 6,026,505 | A | 2/2000 | Hedberg et al. | 714/711 |
| 6,070,256 | A | 5/2000 | Wu et al. | 714/718 |
| 6,118,711 | A | 9/2000 | Merritt | 365/200 |
| 6,205,564 | B1 | 3/2001 | Kim et al. | 714/48 |

OTHER PUBLICATIONS

Technique of Using Compressed Bit-Map for Memory Utilization Research Disclosure, Apr. 1991, No. 324, Kenneth Mason Pub. Ltd. England.

Enhanced Memory addressing diagnostics for intermediate Systems, IBM Technical Disclosure Bulletin, vol. 34, No. 5, Oct. 1991.

Technique of Using Compressed Bit-Map for Memory Utilization, Research Disclosure, Apr. 1991, No. 324, Disclosure 32412.

"Enhanced Memory Addressing Diagnostics For Intermediate Systems", IBM Tech. Discl. Bull.i, vol. 34, No. 5, Oct. 1991, pp. 323-325.

* cited by examiner

*Primary Examiner*—Albert Decady
*Assistant Examiner*—Dipakkumar Gandhi
(74) *Attorney, Agent, or Firm*—Michael J. LeStrange

(57) ABSTRACT

A fault recovery system for an array of memory cells. A register stores data indicating addresses of multi-cell fails and single-cell fails. A first fault correction system accesses data from the register to fix both multi-cell fails and single-cell fails. A second fault correction system does not access said register and fixes single-cell fails. During testing, if a multi-cell fail is detected the register stores its address by deleting an address of a single-cell fail if the register is full.

20 Claims, 2 Drawing Sheets

OPTIMIZED ECC/REDUNDANCY FAULT RECOVERY

CROSS REFERENCE TO RELATED APPLICATIONS

Reference is made to co-pending U.S. Patent application Ser. No. 10/063,495, entitled "Testing of ECC Memories," filed on even date herewith.

BACKGROUND OF THE INVENTION

Technical Field

The present invention relates generally to the field of testing memory arrays, and more particularly to testing memory arrays with ECC circuitry.

In general, in the fabrication of integrated circuits it is important to test the circuits once fabricated to assure they meet the requisite quality and reliability targets for the targeted product application. In memory technologies (be they dynamic random access memories (DRAM); static RAM; or embedded RAM) it is particularly important to conduct these tests so as to identify and replace faulty storage cells, such that the memory can still meet the product application.

Such memories are regular structures which have well defined test pattern sets. By "regular," we mean that a memory array typically has a repeating topology and sequence of transistors and other structures, such that failure mechanisms tend to affect the device in relatively uniform ways, and tend to accurately follow well-established fault models. Normally such test patterns are provided by a test machine that provides both the test patterns and the associated addresses to the address and data I/O of the device under test. Alternatively, a built-in self-test (BIST) macro can be employed that provides such patterns internally. U.S. Pat. No. 6,205,564 B1, "Optimized Built-In Self-Test Method and Apparatus for Random Access Memories" discusses the use of March bit test pattern tests with BIST. A particular embodiment of BIST is discussed in U.S. Pat. No. 5,535,164, "BIST Tester for Multiple Memories," assigned to the assignee of the present invention.

Error correction codes (ECC) such as the well-known Hamming codes for double error detect, single error correct (DED/SEC) are used in higher-end memory systems to correct single bit failures (soft errors) arising from isolated events such as extraneous alpha particle radiation. Memory systems have been proposed that carry out ECC at the chip level. See for example U.S. Pat. No. 4,335,459, "Single Chip Random Access Memory With Increased Yield and Reliability," and U.S. Pat. No. 5,134,616, "Dynamic RAM with On-Chip ECC and Optimized Bit and Word Redundancy," assigned to the assignee of the present invention.

In the past, ECC has been used primarily to correct soft errors (that is, errors that cause a particular bit to fail on a particular occasion) versus hard errors (the memory cell itself is faulty). The latter errors have been corrected by redundancy. Thus, when both ECC and redundancy have been used on a memory product, the typical procedure has been to first test the array and use redundancy to fix hard errors, then using ECC to address soft errors.

However, when single bit Error Correction Code (ECC) is used to repair hard or stuck failures, as opposed to fixing soft failures due to alpha particles or cosmic rays, a different redundancy calculation must be employed from that typically used. Normally when row redundancy is employed, if a failure is seen then a good redundant row is substituted in its place. It doesn't matter whether there is a single cell fail or a full word line fail. See U.S. Pat. No. 6,026,505.

When ECC is on a memory, a single cell fail (SCF) need not be replaced by a redundant row. The ECC alone will provide SCF tolerance. Any multiple cell failure (MCF) must be replaced by a redundant row. If there is a single cell hard fail, however, and there are extra redundant elements left over after all multibit failures have been replaced, then it is desirous that the single cell failure be replaced by a redundant element.

A need has developed in the art for a more sophisticated memory fault correction system that optimizes the use of both ECC and redundancy to correct for failing bits.

BRIEF SUMMARY OF THE INVENTION

It is thus an object of the present invention to optimize the use of both ECC and redundancy to correct for failing bits.

It is another object of the invention to use redundancy to address as many hard fails as possible.

The foregoing and other objects of the invention are realized, in a first aspect, by a fault recovery system for an array of memory cells. A register stores data indicating addresses of multi-cell fails and single-cell fails. A first fault correction system accesses data from the register to fix both multi-cell fails and single-cell fails. A second fault correction system does not access said register and fixes single-cell fails. During testing, if a multi-cell fail is detected the register stores its address by deleting an address of a single-cell fail.

Another aspect of the invention is a method of testing and correcting a memory system, comprising the steps of determining if failing bits are SCFs or part of a MCF; storing addresses of said failing bits, along with at least one bit indicating whether they are SCFs or part of a MCF; and applying a fault recovery methodology to said failing bits, by which all MCFs and at least some SCFs are correctable by a first fault recovery technique that is capable of fixing MCFs and SCFs, and by which remaining SCFs are correctable by a second fault recovery technique that is capable of fixing SCFs only.

In yet another aspect, the invention is a semiconductor product, comprising an array of memory cells; an array of redundant cells; a register that that stores data indicating addresses of multi-cell fails and single-cell fails in said array of memory cells, a portion of said data indicating whether a given stored address is for a multi-cell fail or a single-cell fail; a first fault correction system that accesses data from said register to fix both multi-cell fails and single-cell fails; and a second fault correction system that does not access said register and fixes single-cell fails.

BRIEF DESCRIPTION OF THE SEVERAL VIEWS OF THE DRAWINGS

The foregoing and other features of the invention will become more apparent upon review of the detailed description of the invention as rendered below. In the description to follow, reference will be made to the several figures of the accompanying Drawing, in which.

DETAILED DESCRIPTION OF THE INVENTION

The idea disclosed here allows for a failing address to be stored in a failed address register (FAR). The failing row address is stored in the FAR and any future failures are compared to see if their address is already stored in the FAR. If the failure already has its row address stored then it is known that failure is already being replaced according to the redundancy calculation. The FAR includes information that indicates whether a failure is a single cell failure or a multiple cell failure. This way all failures can be replaced if there is sufficient redundancy and few enough failures. If there is insufficient redundancy to handle all of the failures, priority is given to multi-bit failures, knowing that ECC will fix the single cell failures.

Figure 1:
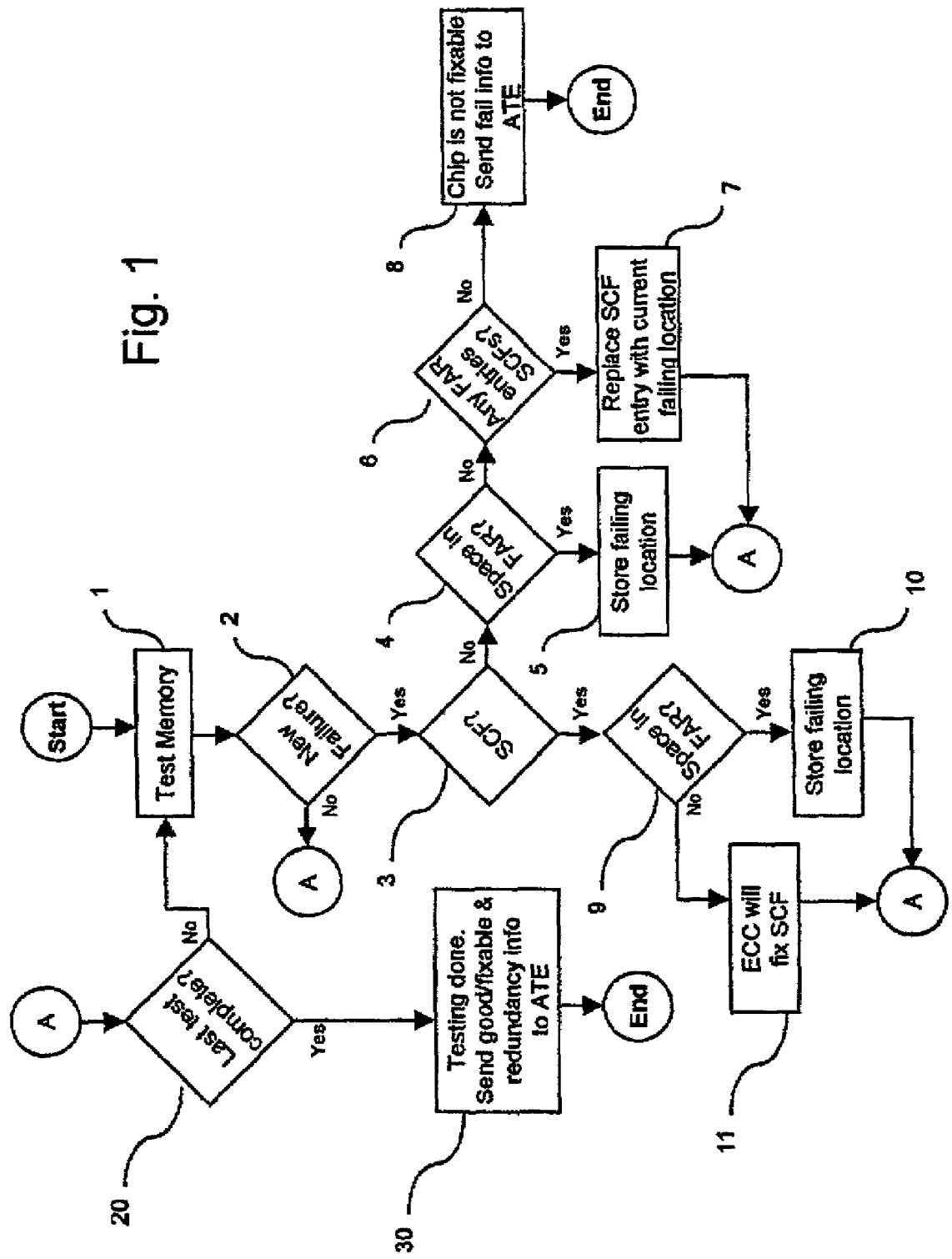
FIG. 1 is a flowchart of the sequence of steps for testing a memory product in accordance with a first embodiment of the present invention.

FIG. 1 is a flowchart of the sequence of steps for testing a memory product in accordance with a first embodiment of the present invention. This flow is implemented as part of the built-in self-test (BIST) on-chip redundancy allocation logic, although it is to be understood that the test patterns per se could be applied by an off-chip test system.

In step 1, a normal test pattern (such as a walking 0's, walking 1's, or a March pattern test such as disclosed in U.S. Pat. No. 5,907,561, "Method to Improve Testing Speed of Memory," and U.S. Pat. No. 6,070,256, "Method and Apparatus for Self-Testing of Multi-Port RAMs") is applied to the memory array. Then in step 2 the BIST determines whether or not a detected failing bit is a new fail or one that has already been encountered. This is done by comparing the row and column address of the presently failing bit to addresses of other failing bits stored in the FAR. If it has already been encountered the method branches to subroutine A. In step 20 of subroutine A, the BIST determines whether or not the test patterns are complete; if not it simply branches back to step 1 and testing resumes. If testing is complete, then in step 30 the FAR information is read out to off-chip automated test equipment (ATE) for analysis, the redundant array is programmed for the addresses of failing rows as indicated by MCFs or SCFs (if any are stored by the FAR, as described below), and the method is completed.

On the other hand, if the failing bit is a new fail, the method progresses to step 3, in which the BIST determines whether or not the failing address is a single cell fail (SCF) or a multiple cell fail (MCF). This is done by separately comparing the row address of the present bit to the row address of the other failing bits; if there is a match, a MCF is indicated, and if not a SCF is indicated. Note that this MCF determination could be based on rows, columns, or both, depending on the redundancy system utilized. In the present invention row redundancy is preferred, hence the MCF determination is based on the row addresses.

If the Failing bit is a MCF the method progresses to step 4, in which the FAR is queried to determine whether or not it has any space left for storing failing addresses. If so, then in step 5 the failing location is stored in the FAR. Note that in addition to storing the address, the FAR also sets a bit that indicates that the fail is a MCF. So the FAR entries indicate both the location and the nature of the particular fail. The process then branches to subroutine A, discussed in more detail above. On the other hand, if there is no longer any space in the FAR to indicate the failing locations, in step 6 the BIST then queries the FAR entries to see if any are SCFs: if so, then in step 7 the address of the SCF is removed and is replaced with the address of the present MCF. The FAR entry is revised to indicate the new address, and the fact that this new address is for a MCF. As such, if all of the redundancy has been allocated and a new multi-bit failure is encountered then a single cell fail address stored in the FAR is kicked out and replaced with the multi-bit fail address and reliance is placed on the ECC to fix the single cell fail. The process then branches to subroutine A, discussed above.

Note that if there are no SCFs left in the FAR, and the present fail is an MCF, then in step 8 the BIST sends a signal off-chip indicating the array is not fixable, in that conventional DED/SEC ECC can only fix single cell fails. The address information for the fail is sent to off-chip automated test equipment (ATE), and the method ends.

Returning to step 3, if the fail is a SCF, then in step 9 the FAR is queried to determine whether or not it has any space left for storing failing bits. If so, then in step 10 the failing location is stored in the FAR. Note that in addition to storing the address, the FAR also sets a separate bit that indicates that the fail is a SCF. Alternatively, if there is no room left in the FAR to store the address, redundancy will not be used to fix the fail; rather, as indicated in step 11, the ECC system will be able to fix it, because it is a SCF. Either way, the method then proceed to subroutine A, discussed above.

Figure 2:
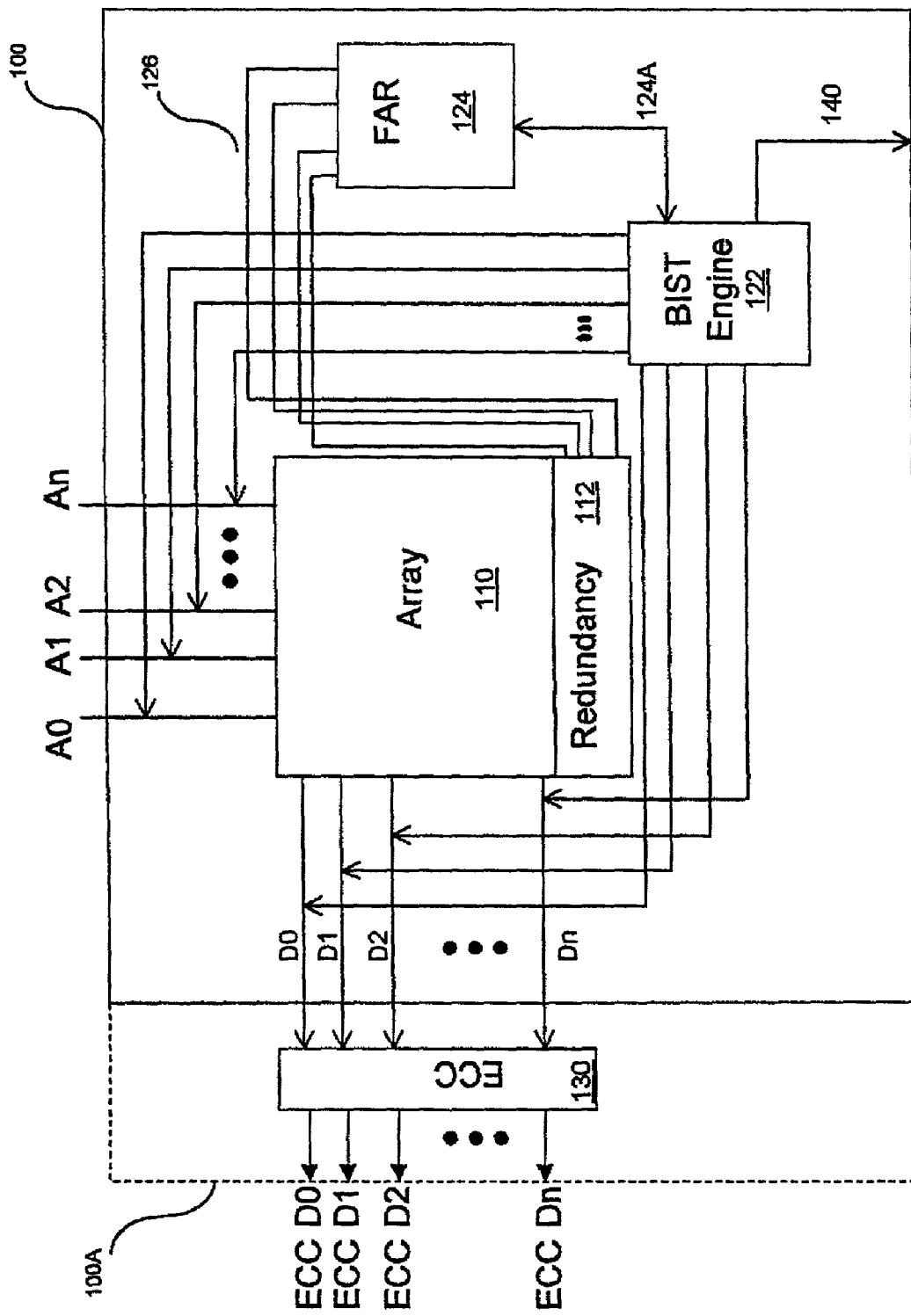
FIG. 2 is a block diagram of a semiconductor product according to a preferred embodiment of the present invention.

FIG. 2 is a block diagram of the memory product of the invention. The memory product is preferably a single integrated circuit chip; it does not have to be, but such an arrangement minimizes cost. Note that the chip is referred to as a "memory product" because it includes a memory array 110 that stores a plurality of memory words, each with an individual address. As a practical matter this product can include extensive logic circuitry; that is, the chip could be essentially a logic product that includes the memory array. Note that the product includes a redundant array 112, with addresses programmed as set forth below. For the purposes of this discussion, each "memory word" can include one or more bytes that in turn are individually accessible; thus, a memory word can be a portion of a word line, or an entire word line, of cells. The memory array has address inputs A0, A1, A2 . . . An, which receive addresses from off-chip sources such as the chip set, and also receive addresses from the on-chip BIST engine BIST ENG 122. While in the invention BIST is preferred as the test engine, a conventional off-chip test engine (e.g. a memory tester that applies test patterns and addresses to the memory product through its respective data and address I/O pads) could be used, so long as there is some other logic (either on-chip or off-chip) that supports the operations set forth in FIG. 1. In general the BIST ENG can also be constructed in the manner taught in the aforementioned U.S. Pat. No. 5,535,164, "BIST Tester for Multiple Memories," the teachings of which are incorporate herein by reference. The BIST ENG 122 provides addresses, control, and data inputs to the memory. The signals from BIST ENG 122 enable the memory to be tested with a sequence of patterns that facilitates finding defects in the memory.

BIST ENG 122 provides address and data information to the array 1110 during test via address inputs A0, A1, A2 . . . An, and data inputs D0, D1, D2 . . . Dn, respectively. When the BIST ENG 122 encounters a fail, the address of the failing cell is sent to the FAR 124 via line 124A, and the BIST ENG 122 and FAR 124 interact as set forth in FIG. 1. Note that at step 30 in FIG. 1, in addition to sending information off-chip to the ATE via output 140, the BIST ENG 122 also causes FAR 124 to serially read out stored addresses via outputs 126 to serially program the decoders of the redundant word lines in redundancy 112. This read out step is not carried out if the method reaches step 8 of FIG. 1. Subsequently, during normal operations, as per usual practice if the incoming addresses A0, A1, A2 . . . An are for a MCF within array 110, a corresponding redundant word line within redundancy 112 will be accessed instead.

Note that the outputs of the memory array are processed by DED/SEC ECC, shown schematically as box 130. The hatching 100A indicates that as a practical matter the ECC could be embodied in hardware included in chip 100, such as in the aforementioned U.S. Pat. No. 5,134,616 (the teachings of which are incorporated herein by reference), or it could be carried out by software executed on a real-time basis. The latter is preferred, to optimize the tradeoffs between chip size and performance. The resulting data, indicated by ECC D0, ECC D1, ECC D2 . . . ECC Dn, is thus cleansed of single bit errors, and is sent to the chip set (not shown) for use by the system.

The invention stores address information and SCF/MCF indications. Redundancy is used to fix all MCFs; if the number of MCFs exceed the capacity of the redundant array, the array is no longer fixable. If not, then the remaining capacity is allocated to as many SCFs as remain. Any SCFs not fixed by redundancy are fixed by ECC. Thus, the invention provides comprehensive coverage of cell fails by optimizing the tradeoffs between use of redundancy and use of ECC.

As a practical matter, the design of the memory product described above can be represented in software formatted in any one of a number of formats. It is preferred the design data be in an industry standard format such as GDSII. The data can be downloaded to a storage media such as tape or disc, and/or transmitted from a designer to a mask fabricator (e.g., via the Internet). The data is then used to fabricate photolithographic masks (that is, masks are made that embody the final design in the critical etch processes used to fabricate integrated circuit chips), and the masks are used to fabricate integrated circuit chips, all pursuant to conventional techniques.

The invention can be utilized in conjunction with a variety of business models. The most straightforward example is design and fabrication by a vertically integrated semiconductor manufacturer. An alternative is to have the design for the entire memory product or of the compression circuit available to customers as a macro in an ASICs library. The customer or its designee could combine such macros along with other macros to design a chip product in the manufacturers ground rules. Or the customer could design part or all of the product on its own, and submit the design for mapping into the manufacturers ground rules. In some scenarios the base design comes from one company, the ASIC design/mapping from a second, the masks from a third, and the chip fabrication from a fourth. Obviously all sorts of permutations and combinations of the foregoing business models are possible.

While the invention has been described above with reference to the preferred embodiments thereof, it is to be understood that the spirit and scope of the invention is not limited thereby. Rather, various modifications may be made to the invention as described above without departing from the overall scope of the invention as described above and as set forth in the several claims appended hereto. For example, instead of the FAR being separate from the decoders of the redundant array, the FAR and the decoders could be integrated by assigning each address location in the FAR to a particular redundant word line.

What is claimed is:

1. A method of testing and correcting a memory system, having single cell-fails (SCFs) or multi-cell fails (MCFs), comprising the steps of identifying failing bits as SCFs or part of a MCF;

storing addresses of said failing bits, along with at least one bit indicating whether they are SCFs or part of a MCF; and applying a fault recovery methodology to said failing bits, by which all MCFs and at least some SCFs are correctable by a first fault recovery technique that is capable of fixing MCFs and SCFs, and by which remaining SCFs are correctable by a second fault recovery technique that is capable of fixing SCFs only.

2. The method of claim 1, wherein addresses for said failing bits are stored in a failure address register.

3. The method of claim 2, wherein said identifying step comprises comparing an address for a failing bit with addresses in said failure address register.

4. The method of claim 3, wherein if said failing bit is part of a MCF, the failure address register is queried to determine if it has unused storage space, and if so an address for said MCF is stored in said failure address register, and said MCF is subsequently corrected by said first fault recovery technique.

5. The method of claim 4, wherein said first fault recovery technique comprises redundancy.

6. The method of claim 4, wherein if said failure address register does not have unused storage space, the failure address register is queried to determine if any of its entries are for SCFs, and if so such SCF entry is replaced with said address for said MCF, and said MCF is subsequently corrected by said first fault recovery technique.

7. The method of claim 6, wherein said first fault recovery technique comprises redundancy.

8. The method of claim 4, wherein if said failure address register does not have unused storage space, and if none of its entries are for SCFs, an indication is provided that the memory array is not fixable.

9. The method of claim 3, wherein if said failing bit is part of a SCF, the failure address register is queried to determine if it has unused storage space, and if so an address for said SCF is stored in said failure address register.

10. The method of claim 9, wherein if said failure address register does not have unused storage space, said SCF is corrected by said second fault recovery technique.

11. The method of claim 10, wherein said second fault recovery technique comprises ECC.

12. A fault recovery system for an array of memory cells, having to identify multi-cell fails and single-cell fails, comprising a register that stores data indicating addresses along with at least one bit indicating it they are multi-cell fails and single-cell fails, a first fault correction system that accesses data from said register to fix both multi-cell fails and single-cell fails, and a second fault correction system that does not access said register and fixes single-cell fails, wherein during testing if a multi-cell fail is detected the register stores its address by deleting an address of a single-cell fail.

13. The system of claim 12, wherein said first fault correction system comprises an array of redundant memory cells that are programmed with addresses stored in said register.

14. The system of claim 13, wherein said second fault correction system comprises ECC.

15. The system of claim 14, wherein said system further comprises a BIST engine.

16. The system of claim 15, wherein said BIST engine provides addresses of failing bits to said register during testing.

17. A semiconductor product, having logic to identify multi-cell fails and single-cell fails, comprising:

an array of memory cells;

an array of redundant cells;

a register that that stores data indicating addresses along with at least one bit indicating if they are multi-cell fails and single-cell fails in said array of memory cells, a portion of said data indicating whether a given stored address is for a multi-cell fail or a single-cell fail;

a first fault correction system that accesses data from said register to fix both multi-cell fails and single-cell fails; and a second fault correction system that does not access said register and fixes single-cell fails.

18. The system of claim 17, wherein said first fault correction system comprises an array of redundant memory cells that are programmed with addresses stored in said register.

19. The system of claim 18, wherein said second fault correction system comprises ECC.

20. The system of claim 19, wherein said system further comprises a BIST engine that provides addresses of failing bits to said register during testing.

* * * * *